(12) United States Patent
Yu et al.

(10) Patent No.: US 10,872,874 B2
(45) Date of Patent: Dec. 22, 2020

(54) BONDING APPARATUS AND METHOD OF BONDING SUBSTRATES

(71) Applicant: Taiwan Semiconductor Manufacturing Co., Ltd., Hsinchu (TW)

(72) Inventors: Chen-Hua Yu, Hsinchu (TW); Ebin Liao, Hsinchu (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 125 days.

(21) Appl. No.: 16/109,769

(22) Filed: Aug. 23, 2018

(65) Prior Publication Data

US 2019/0267347 A1 Aug. 29, 2019

Related U.S. Application Data

(60) Provisional application No. 62/634,929, filed on Feb. 26, 2018.

(51) Int. Cl.
| | |
|---|---|
| *H01L 23/00* | (2006.01) |
| *H01L 27/146* | (2006.01) |
| *B30B 5/02* | (2006.01) |
| *B29C 65/00* | (2006.01) |

(52) U.S. Cl.
CPC ............. *H01L 24/75* (2013.01); *H01L 24/83* (2013.01); *H01L 27/1469* (2013.01); *H01L 27/14634* (2013.01); *B29C 66/81455* (2013.01); *B30B 5/02* (2013.01); *H01L 2224/7555* (2013.01); *H01L 2224/75252* (2013.01); *H01L 2224/75303* (2013.01); *H01L 2224/75981* (2013.01); *H01L 2224/83201* (2013.01); *H01L 2224/83894* (2013.01); *H01L 2924/1431* (2013.01); *H01L 2924/3511* (2013.01); *H01L 2924/35121* (2013.01)

(58) Field of Classification Search
CPC ..................... H01L 24/75; H01L 24/83; H01L 2224/75252; H01L 2224/75301; H01L 2224/75302; H01L 2224/7555; H01L 2224/83201; H01L 24/26; H01L 24/27; B30B 5/02; B29C 2043/3647; B29C 66/81455
See application file for complete search history.

(56) References Cited

U.S. PATENT DOCUMENTS

| | | | | |
|---|---|---|---|---|
| 5,131,968 A | * | 7/1992 | Wells | B32B 37/0007 148/DIG. 135 |
| 2012/0264354 A1 | * | 10/2012 | Liao | B24B 49/10 451/6 |
| 2015/0279715 A1 | * | 10/2015 | Burggraf | H01L 21/67092 156/212 |
| 2018/0158796 A1 | * | 6/2018 | Otsuka | H01L 21/2007 |

* cited by examiner

*Primary Examiner* — Carson Gross
(74) *Attorney, Agent, or Firm* — JCIPRNET

(57) ABSTRACT

A bonding apparatus includes a chuck and a bonding head. The chuck is configured to carry a plurality of substrates to be bonded. The bonding head has a cavity facing the chuck and includes a divider, at least one pneumatic component and a diaphragm. The divider is disposed in the cavity and dividing the cavity into a plurality of compartments. The at least one pneumatic component is disposed in at least one of the compartments. The diaphragm covers the cavity and is disposed between the at least one pneumatic component and the chuck.

20 Claims, 4 Drawing Sheets

BONDING APPARATUS AND METHOD OF BONDING SUBSTRATES

CROSS-REFERENCE TO RELATED APPLICATION

This application claims the priority benefits of U.S. provisional application Ser. No. 62/634,929, filed on Feb. 26, 2018. The entirety of the above-mentioned patent application is hereby incorporated by reference herein and made a part of this specification.

BACKGROUND

In today's electronics industry, advanced packaging techniques are being developed and continue to be developed to increase levels of integration. Semiconductor devices are formed on a semiconductor substrate, also known as a wafer, which includes a multitude of individual semiconductor devices, known as chips after they are separated from one another. After semiconductor devices are formed on a semiconductor substrate, and separated into the individual chips, the chips must be bonded to other chips and/or other components and it is logically desirable to join as many semiconductor chips as possible in a package of reduced size.

Wafer Level Chip Scale Packaging, WLCSP, and other hermetic packaging techniques bond chips directly together and can be used to produce finer pitch semiconductor device packages and products that do not require wires or pins but instead utilize contact pads. Direct chip to chip, also referred to as wafer-to-wafer bonding techniques are utilized in such advanced packaging techniques and require superior wafer bonding strength for package qualification. However, wafer warpage is detrimental to the bonding process and tends to decrease the overall process yield and may degrade the quality and reliability of the packages that are produced. The bonding strength would be significantly affected when bonding surfaces to be joined together are warped. The warpage may cause poor adhesion between the wafers in the resulting packages, poor resistance to moisture, package cracking, and the like. As a result, reliability issues are more likely to occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
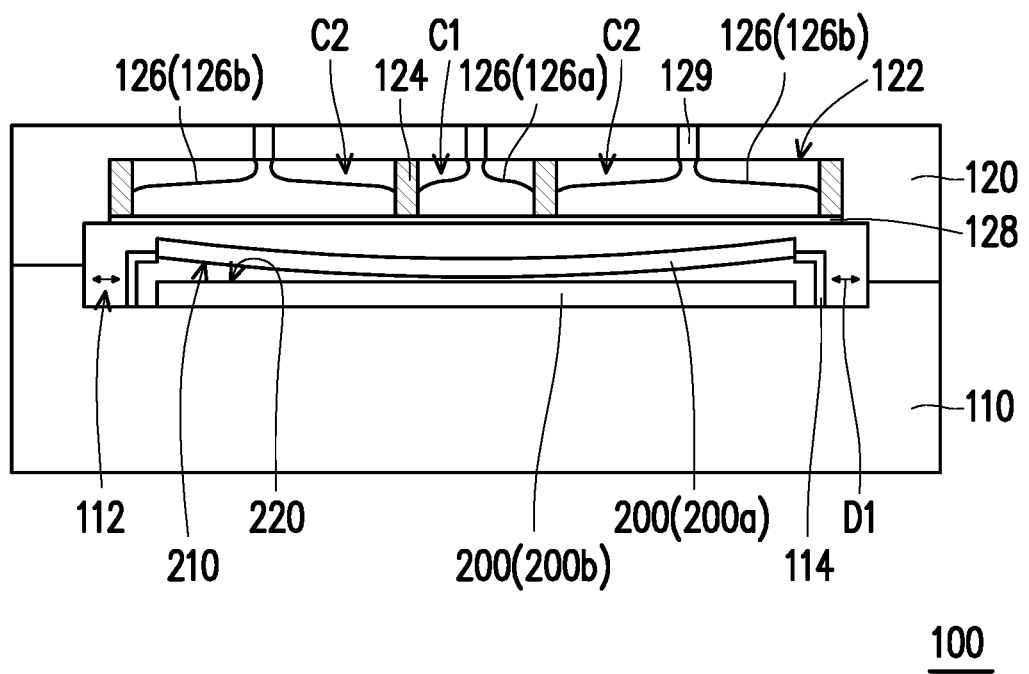
FIG. 1 illustrates a cross sectional view of a bonding apparatus according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figure 2:
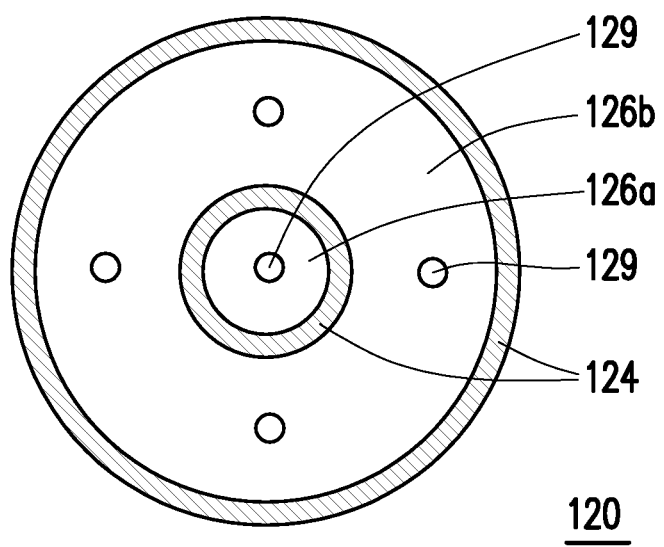
FIG. 2 illustrates a top view of a bonding head of a bonding apparatus according to some exemplary embodiments of the present disclosure.

FIG. 1 illustrates a cross sectional view of a bonding apparatus according to some exemplary embodiments of the present disclosure. FIG. 2 illustrates a top view of a bonding head of a bonding apparatus according to some exemplary embodiments of the present disclosure. It is noted that some components are omitted in the top view of the bonding head in FIG. 2 for the simplicity of the drawings. Aspects of the disclosure provide a bonding apparatus and a bonding method applicable to wafer-to-wafer bonding with improved wafer to wafer bonding strength and hermetic quality. However, the disclosure is not limited thereto. The bonding apparatus and the bonding method in the disclosure may also be applied to bond any kinds of substrates together.

Referring to FIG. 1 and FIG. 2, in accordance with some embodiments of the disclosure, a bonding apparatus 100 may include a chuck 110 and a bonding head 120. The chuck 110 is configured to carry a plurality of substrates 200 to be bonded. It is noted that two substrates 200 are illustrated in the present embodiment; however, the disclosure is not limited thereto. In other embodiments, more than two substrates can be provided on the chuck 110 of the bonding apparatus 100 for being bonded together. In some embodiments, the substrates 200 (e.g. an upper substrate 200a and a lower substrate 200b) provided on the chuck 110 may be two semiconductor wafers generally aligned and ready to be bonded together for a wafer to wafer bonding process. Each of the wafers may be a chip containing individual semiconductor device or an integrated substrate with multiple individual semiconductor devices.

In some embodiments, each of the wafers may be a semiconductor substrate that includes semiconductor devices formed using various technologies. The semiconductor substrates of the wafers may each include bulk silicon, doped or undoped, or an active layer of a semiconductor-on-insulator (SOI) substrate. Generally, an SOI includes a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used. Conventional semiconductor fabrication methods may be used to produce the wafers to include various semiconductor devices thereon such as CMOS devices and/or MEMS (micro-electromechanical structure) devices.

The circuitry formed on the substrate may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in the one or more dielectric layers.

For example, the circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided merely for illustrative purposes to further explain applications of the present invention and are not meant to limit the disclosure in any manner. Other circuitry may be used as appropriate for a given application.

In the illustrated embodiment, the substrates 200a, 200b to be bonded include different features but it should be understood that in other exemplary embodiments, the substrates 200a, 200b to be bonded may be identical. In some embodiments, the upper substrate 200a includes a bonding surface 210 and the lower substrate 200b includes a bonding surface 220. The bonding surfaces 210, 220 facing each other in the illustrated embodiment. In some embodiments, the bonding surfaces 210, 220 each has a interconnect layer formed thereon, and each of the interconnect layers may include contacts formed in one or more dielectric layers. In some embodiments, bonding material may be applied on the bonding surface 210 and/or the bonding surface 220. In some embodiments, the bonding material may be any of various suitable metal or metal alloy and may also include suitable dopant species. The bonding material may be formed on the respective substrates 200a, 200b through various deposition operations such as PVD (physical vapor deposition), sputtering, plating, evaporation, CVD (chemical vapor deposition) or other deposition operations. Optionally, in some embodiments, other process such as chemical mechanical polishing (CMP) process or plasma treatment process may further be applied to the bonding material after the bonding material is formed on the respective substrates 200a, 200b. Suitable bonding materials include aluminum (Al), stannum (Sn), germanium (Ge), aurum (Au), copper (Cu), silicon (Si) and plumbum (Pb), but other suitable bonding materials may also be used. In some embodiments, the bonding materials appear as patterned film segments, i.e. they do not extend completely over their respective bonding surfaces 210, 220. Various suitable and known techniques may be used to pattern the bonding material to produce the patterned segments of the bonding material. As noted supra, some of the illustrated characteristics have been arbitrarily expanded for clarity, distorting the relative dimensions of the characteristics.

The bonding head 120 has a cavity 122 facing the chuck 110, and the bonding head 120 includes a divider 124, at least one pneumatic component 126 and a diaphragm 128. For example, the substrates 200 to be bonded may include an upper substrate 200a and a lower substrate 200b arranged in a face-to-face manner. Each of substrates 200 may be a wafer having semiconductor devices formed therein and an interconnection structure disposed on the wafer and electrically connected to the semiconductor devices. For example, the upper substrate 200a may be a first wafer including a plurality of CMOS image sensor chips (i.e. a CIS wafer) and the second substrate 200b may be a second wafer including a plurality of logic integrated circuit chips (i.e. a logic wafer). However, the disclosure is not limited thereto. In some embodiments, the chuck 110 may include a positioning cavity 112 and a positioning mechanism 114. The positioning cavity 112 faces the bonding head 120 and corresponding to the cavity 122 of the bonding head 120. The substrates 200a, 200b are disposed in the positioning cavity 112.

In some embodiments, the positioning mechanism 114 is movably disposed in the positioning cavity 112 to hold the substrates 200a, 200b in place. In detail, before the bonding head 120 moves toward the chuck to press the substrates 200a, 200b together, an upper portion of the positioning mechanism 114 may be extended between the substrates 200a, 200b. With such arrangement, the upper substrate 200a is actually leaned on the upper portion of the positioning mechanism 114 instead of directly contacting the bonding surface 220 of the lower substrate 200b, so as to avoid damaging the bonding surfaces 210, 220 during the placement of the substrates 200a, 200b. Then, the positioning mechanism 114 may be moved away (e.g. along the direction D1) from the substrates 200a, 200b, so the substrates 200a, 200b can be pressed together by the bonding head 120. Alternatively, the positioning mechanism 114 may be moved downward (e.g. along a direction perpendicular to the direction D1) to be embedded in the chuck 110, so the substrates 200a, 200b can be pressed together by the bonding head 120. In such embodiment, the chuck 110 may include a receiving cavity for receiving the positioning mechanism 114 therein. The disclosure does not limit the formation, arrangement and the movement of the positioning mechanism 114 as long as it holds the substrates 200a, 200b in place during the placement of the substrates 200a, 200b and yields during the bonding of the substrates 200a, 200b.

In some embodiments, the chuck 110 and the bonding head 120 are configured to be movable relative to each other. The divider 124 is disposed in the cavity 122 to divide the cavity 122 into a plurality of compartments C1, C2. The at least one pneumatic component 126 is disposed in at least one of the compartments C1, C2. The pneumatic component 126 may be a pneumatic bladder, which can be inflated or deflated by, for example, a gas pump. The volume of the pneumatic component 126 can be adjusted according to the amount of gas injected therein. In some embodiments, the bonding head 120 further includes at least one gas inlet 129 in gas communication with the pneumatic component 126 to inflate or deflate the pneumatic component 126. The diaphragm 128 with flexibility covers the cavity 122 and is disposed between the pneumatic component 126 and the chuck 110. With such arrangement, when the pneumatic component 126 is inflated with gas via the gas inlet 129, the diaphragm 128 is pushed toward the upper substrates 200a by the inflated pneumatic component 126, so as to press against the upper substrates 200a to be bonded with the lower substrate 200b. In other words, when the pneumatic component 126 is inflated by the gas inlet 129, the pneumatic component 126 applies bonding force onto the substrates 200a, 200b through the diaphragm 128. In some embodiments, the diaphragm 128 may be made of compliant material such as silicone rubber, etc.

In the illustrated embodiment, the divider 124 divides the cavity 122 into a central compartment C1 and a peripheral compartment C2. In other words, the compartments includes the central compartment C1 and the peripheral compartment C2 surrounding the central compartment C1. In the present embodiments, the number of the pneumatic component 126 may be plural. The pneumatic components 126 includes a central pneumatic component 126a and a peripheral pneumatic component 126b. The central pneumatic component 126a and the peripheral pneumatic component 126b are disposed in the central compartment C1 and the peripheral compartment C2 respectively. In some embodiments, the peripheral compartment C2 can be in a single donut shape and so is the peripheral pneumatic component 126b, which is configured in a concentric manner with respect to the central pneumatic component 126a. In some embodiments, the central pneumatic component 126a and the peripheral pneumatic component 126b may apply pressing force to the substrates 200 by being inflated independently.

For example, the central pneumatic component 126a is firstly inflated via the gas inlet 129 to apply a first pressing force to press a center region of the substrates 200 together. Therefore, the air between the center regions of the substrates 200 is discharged to avoid popcorn effect. Then, the peripheral pneumatic component 126b is inflated via the gas inlet 129 to apply a second pressing force to press a peripheral region of the substrates 200 together, so the bonding surface 210 and 220 of the substrates 200a and 200b are tightly and comprehensively bonded with each other. The center region of the substrates 200 may correspond to the central pneumatic component 126a of the bonding head 120, and the peripheral region of the substrates 200 may correspond to the peripheral pneumatic component 126b of the bonding head 120. In some embodiments, a diameter of the cavity 122 is substantially greater than a diameter of each of the substrates 200 to be bonded. Accordingly, the pressing force applied by the central pneumatic component 126a and the peripheral pneumatic component 126b in the cavity 122 (e.g. in the compartments C1 and C2 of the cavity 122) can be distributed comprehensively on the substrates 200. For example, a diameter of the cavity 122 is substantially equal to or greater than 300.5 mm. In one of the implementations, the diameter of the cavity 122 is about 320 mm, but the disclosure is not limited thereto.

In general, a warpage of the upper substrate 200a can be a negative warpage, which means the central portion of the upper substrate 200a is substantially lower than the edge portion of the upper substrate 200a. Conversely, a warpage can be a positive warpage, which means the central portion of the upper substrate 200a is substantially higher than the edge portion. In the embodiments of the upper substrate 200a having negative warpage (smiling shape) as shown in FIG. 1, the spacing between the central portions of the substrates 200a and 200b is substantially smaller than the spacing between the edge portions of the substrates 200a and 200b. Accordingly, the second pressing force applied by the peripheral pneumatic component 126b is substantially greater than the first pressing force applied by the central pneumatic component 126a, so as to calibrate the warpage of the substrates 200 and enhance the bonding strength thereof. Namely, the inflation magnitude of the peripheral pneumatic component 126b is substantially greater than the inflation magnitude of the central pneumatic component 126a. With such configuration, the pressing force applied onto the substrates 200 by the bonding head 120 can be controlled independently to provide superior bonding strength and hermetic quality. In addition, issue of delamination or popcorn effect due to air trapped between the substrates 200 can be avoided to improve yield rate of the substrate bonding process.

It is noted that the pressing force applied onto the substrates 200 can be adjusted freely according to the profile of the substrates. In an embodiment of the substrate 200a having positive warpage (crying shape), the spacing between the central portions of the substrates 200a and 200b is substantially greater than the spacing between the edge portions of the substrates 200a and 200b. Accordingly, the first pressing force applied by the central pneumatic component 126a may be substantially greater than the second pressing force applied by the peripheral pneumatic component 126b to calibrate the positive warpage of the substrates 200 and enhance the bonding strength thereof.

Figure 3:
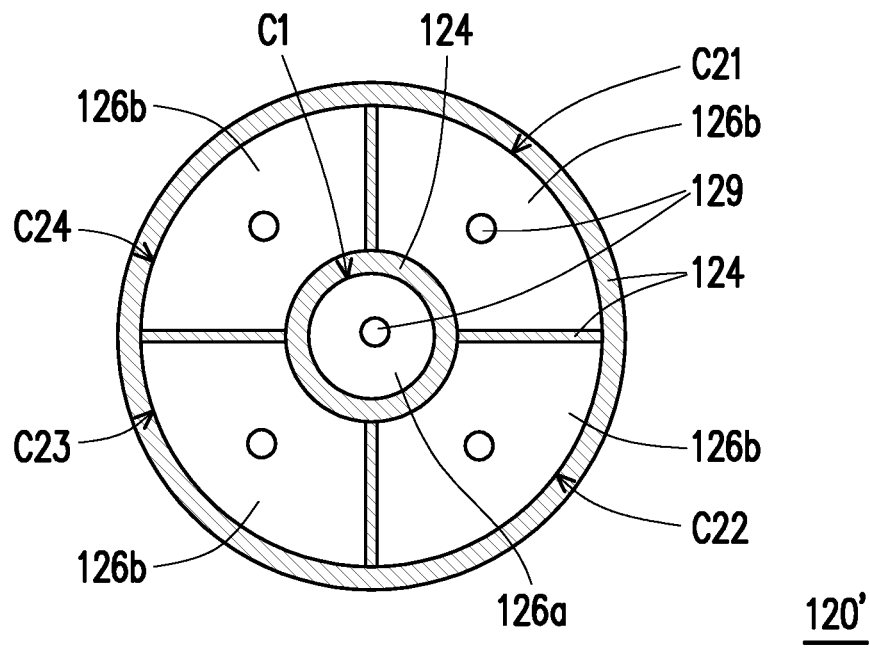
FIG. 3 illustrates a top view of a bonding head of a bonding apparatus according to some exemplary embodiments of the present disclosure.

FIG. 3 illustrates a top view of a bonding head of a bonding apparatus according to some exemplary embodiments of the present disclosure. It is noted that the bonding head 120' shown in FIG. 3 contains many features same as or similar to the bonding head 120 disclosed earlier with FIG. 1 and FIG. 2. For purpose of clarity and simplicity, detailed description of same or similar features may be omitted, and the same or similar reference numbers denote the same or like components. The main differences between the bonding head 120' shown in FIG. 3 and the bonding head 120 disclosed earlier with FIG. 1 and FIG. 2 are described as follows.

Referring to FIG. 1 and FIG. 3, in the illustrated embodiment, the peripheral compartment further includes a plurality of sub-compartments C21, C22, C23 and C24 divided by the divider 124. The sub-compartments C21, C22, C23 and C24 together surround the central compartment C1. In other words, the sub-compartments C21, C22, C23 and C24 jointly form a circle surrounding the central compartment C1. Accordingly, the pneumatic component 126 includes a central pneumatic component 126a disposed in the central compartment C1 and a plurality of peripheral pneumatic components 126b disposed in the sub-compartments C21, C22, C23 and C24 respectively. With such configuration, the pressing force applied onto the substrates 200 by the pneumatic components 126a and 126b can be controlled more precisely to further improve bonding strength and hermetic quality between the substrates 200.

For example, in the embodiments of the substrates having negative warpage (smiling shape) as it is shown in FIG. 1, the inflation magnitude of each of the peripheral pneumatic components 126b is substantially greater than the inflation magnitude of the central pneumatic component 126a.

Thereby, different pressing force can be provided onto different region of the substrates 200 to calibrate the warpage of the substrates 200. Furthermore, the inflation magnitude of each of the peripheral pneumatic components 126b may be different according to the warpage profile of the substrates 200 to adjust the warpage of the substrates 200 in a more precise manner. With such configuration, the pressing force applied onto the substrates 200 by each of the pneumatic components 126a and 126b can be controlled independently to provide superior bonding strength and hermetic quality. In addition, by inflating the central pneumatic component 126a first, issue of delamination or popcorn effect due to air trapped between the substrates 200 can be avoided. In some embodiments, the peripheral compartment C21, C22, C23 and C24 can have different inner radiuses and widths according to actual requirement of the pressing forces applied to the substrates 200.

Figure 4:
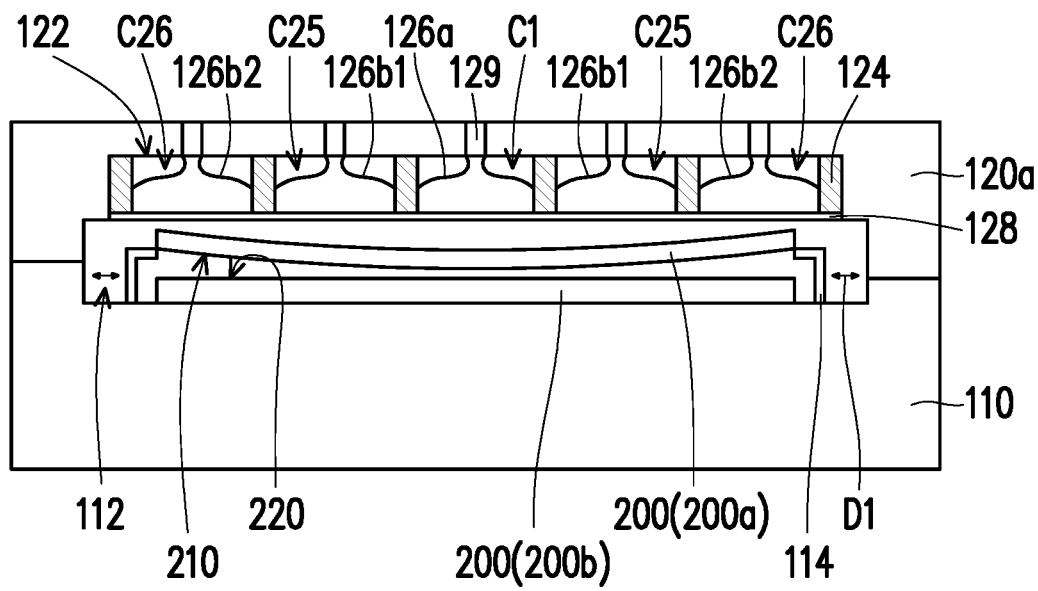
FIG. 4 illustrates a cross sectional view of a bonding apparatus according to some exemplary embodiments of the present disclosure.
Figure 5:
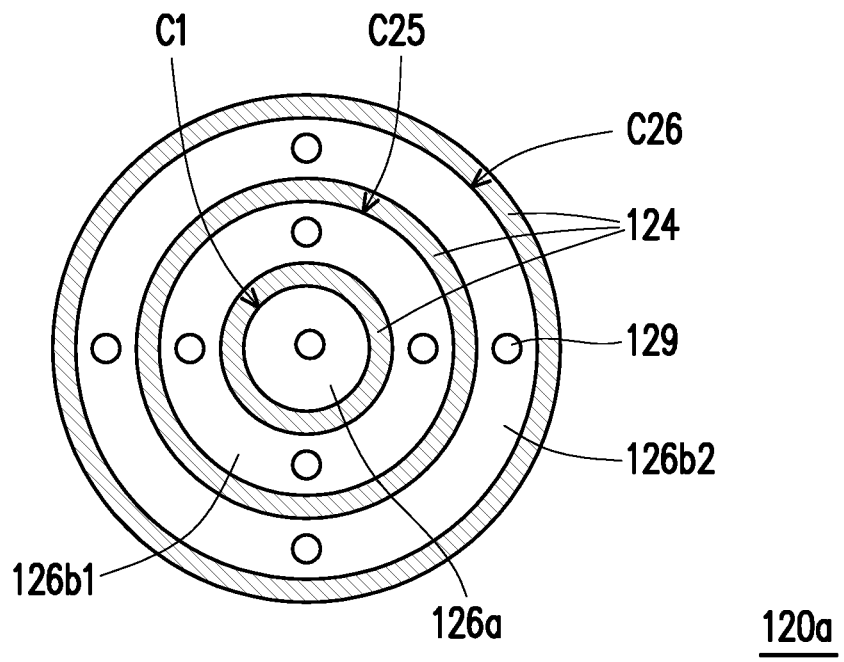
FIG. 5 illustrates a top view of a bonding head of a bonding apparatus according to some exemplary embodiments of the present disclosure.

FIG. 4 illustrates a cross sectional view of a bonding apparatus according to some exemplary embodiments of the present disclosure. FIG. 5 illustrates a top view of a bonding head of a bonding apparatus according to some exemplary embodiments of the present disclosure. It is noted that the bonding apparatus 100a shown in FIG. 4 contains many features same as or similar to the bonding apparatus 100 disclosed earlier with FIG. 1 and FIG. 2. For purpose of clarity and simplicity, detailed description of same or similar features may be omitted, and the same or similar reference numbers denote the same or like components. The main differences between the bonding apparatus 100a shown in FIG. 4 and the bonding apparatus 100 disclosed earlier with FIG. 1 and FIG. 2 are described as follows.

Referring to FIG. 4 and FIG. 5, in the illustrated embodiment, the peripheral compartment further includes a plurality of concentric compartments C25 and C26 divided by the divider 124. The concentric compartments C25 and C26 are arranged in a concentric manner with respect to the central compartment C1. Accordingly, the pneumatic component includes a central pneumatic component 126a and a plurality of peripheral pneumatic components 126b1 and 126b2. The central pneumatic component 126a is disposed in the central compartment C1, and the peripheral pneumatic components 126b1 and 126b2 are disposed in the concentric compartments C25 and C26 respectively. With such configuration, the pressing force applied onto the substrates 200 by the central pneumatic component 126a, the peripheral pneumatic component 126b1 and the peripheral pneumatic component 126b2 can be controlled more precisely to further improve bonding strength and hermetic quality between the substrates 200. It is noted that the disclosure does not limit the number of concentric compartments and the number of the peripheral pneumatic components.

For example, in the embodiments of the upper substrate 200a having negative warpage (smiling shape) as it is shown in FIG. 4, the inflation magnitude of each of the peripheral pneumatic components 126b1 and 126b2 is substantially greater than the inflation magnitude of the central pneumatic component 126a. Thereby, different pressing force can be provided onto different region of the substrates 200 to calibrate the warpage of the substrates 200. Furthermore, the inflation magnitude of the peripheral pneumatic component 126b2 can be substantially greater than the inflation magnitude of the peripheral pneumatic component 126b1. Namely, the pressing forces applied by the pneumatic components 126a, 126b1 and 126b2 onto the substrates 200 gradually increases from the center region to the peripheral region of the substrates 200 to adjust the warpage of the substrates 200 in a more precise manner. With such configuration, the pressing force applied onto the substrates 200 by each of the pneumatic components 126a, 126b1 and 126b2 can be controlled independently to provide superior bonding strength and hermetic quality between the substrates 200. In addition, by inflating the central pneumatic component 126a first, issue of delamination or popcorn effect due to air trapped between the substrates 200 can be avoided.

Figure 6:
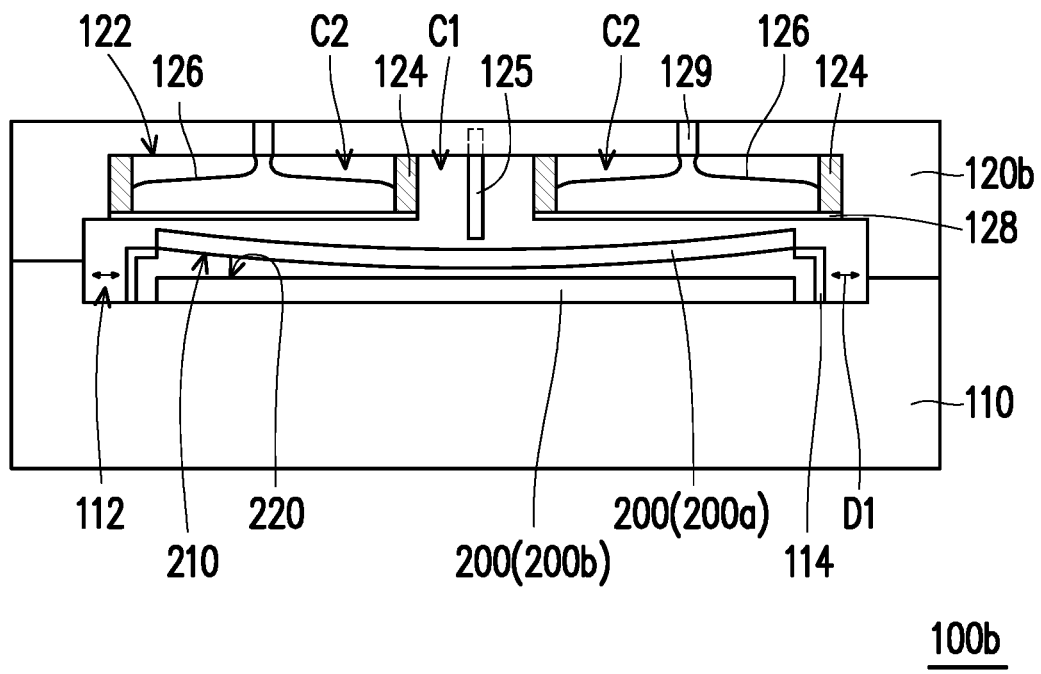
FIG. 6 illustrates a cross sectional view of a bonding apparatus according to some exemplary embodiments of the present disclosure.

FIG. 6 illustrates a cross sectional view of a bonding apparatus according to some exemplary embodiments of the present disclosure. It is noted that the bonding apparatus 100b shown in FIG. 6 contains many features same as or similar to the bonding apparatus 100 disclosed earlier with FIG. 1 and FIG. 2. For purpose of clarity and simplicity, detailed description of same or similar features may be omitted, and the same or similar reference numbers denote the same or like components. The main differences between the bonding apparatus 100b shown in FIG. 6 and the bonding apparatus 100 disclosed earlier with FIG. 1 and FIG. 2 are described as follows.

In some embodiments, bonding apparatus 100b further include a pressing pin 125, which is movably disposed in the central compartment C1. The pneumatic component 126 is disposed in the peripheral compartment C2. The diaphragm 128 exposes the central compartment 125 for the pressing pin 125 to be able to protrude out, and the diaphragm 128 covers the peripheral compartment C2 so the diaphragm 128 is able to press against the substrates 200 when the pneumatic component 126 is inflated. With such configuration, the method for bonding the substrates 200 may include the following process. Firstly, the substrates 200 (e.g. an upper substrate 200a and a lower substrate 200b) are provided on the chuck 110. The upper substrate 200a is stacked on the lower substrate 200b in a superimposed manner. Then, the pressing pin 125 is moved toward the chuck 110 to make a central region of the upper substrate 200a in contact with a central region of the lower substrate 200b. Therefore, the air between the center regions of the substrates 200 is discharged to avoid issue of delamination or popcorn effect. Then, the pneumatic component 126 surrounding the pressing pin 125 is inflated to apply pressing force on a peripheral region of the upper substrate 200a to make the peripheral region of the upper substrate 200a in contact with a peripheral region of the lower substrate 200b.

In the embodiments of the upper substrate 200a having negative warpage (smiling shape) as shown in FIG. 6, the pressing force applied by the pneumatic component 126 is substantially greater than the pressing force applied by the pressing pin 125, so as to calibrate the warpage of the substrates 200 and enhance the bonding strength thereof. With such configuration, the pressing force applied onto the substrates 200 in different region can be controlled independently to provide superior bonding strength and hermetic quality. In addition, by applying pressing force in the center with the pressing pin first, issue of delamination or popcorn effect due to air trapped between the substrates 200 can be avoided to improve yield rate of the substrate bonding process. In some embodiments, the peripheral compartment C2 is in a single donut shape and so is the pneumatic component 126, which is configured in a concentric manner with respect to the central compartment C1. However, the disclosure is not limited thereto, in other embodiments, the pneumatic component 126 disposed in the peripheral compartment C2 can also be arranged as the embodiments shown in FIG. 3 and FIG. 5 or any other suitable manner.

Figure 7:
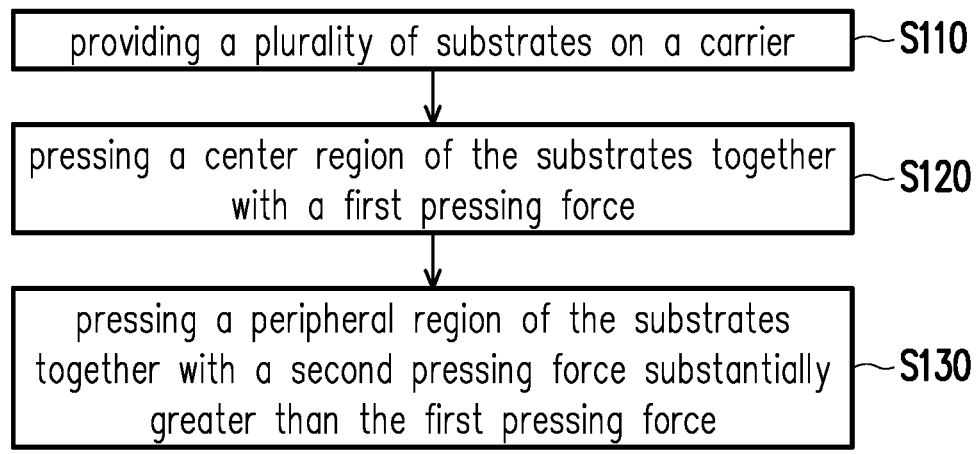
FIG. 7 illustrates a flow chart of a method of bonding substrates according to some exemplary embodiments of the present disclosure.

FIG. 7 illustrates a flow chart of a method of bonding substrates according to some exemplary embodiments of the present disclosure. With the bonding apparatus noted supra, a method of bonding substrates 200 is developed, and the method may include the following steps. The following description are taking the bonding apparatus 100 as an example for illustrating the method, but those skilled in the art should appreciate that other bonding apparatus such as the bonding apparatus 100a, 100b may also be adopted to the method.

Referring to FIG. 1, FIG. 2 and FIG. 7, in some embodiments, the method for bonding the substrates 200 may include the following process. Firstly, at step S110, the substrates 200 (e.g. the upper substrate 200a and the lower substrate 200b) are provided on the chuck 110 of the bonding apparatus 100 with the bonding surfaces 210, 220 facing each other. In some embodiments, bonding material may be applied on the bonding surface 210 and/or the bonding surface 220, and the positioning mechanism 114 may be movably disposed in the positioning cavity 112 to hold the upper substrate 200a and the lower substrate 200b in place. In detail, at an initial state (before the pressing force is applied to press the substrates 200a, 200b together), the positioning mechanism 114 is at a position where the upper portion of the positioning mechanism 114 is extended between the substrates 200a, 200b. With such configuration, the upper substrate 200a can be leaned on the upper portion of the positioning mechanism 114 instead of directly contacting the bonding surface 220 of the lower substrate 200b, so as to avoid damaging the bonding surfaces 210, 220 during the placement of the substrates 200a, 200b. Then, the positioning mechanism 114 may be moved away (e.g. along the direction D1) from the substrates 200a and 200b, so the substrates 200a and 200b can be bonded together by the bonding head 120.

Then, at step S120, a center region of the substrates 200 is pressed together with a first pressing force. In the illustrated embodiment, the first pressing force is applied by the center pneumatic component 126a disposed in the center compartment C1 of the bonding head 120. However, the disclosure is not limited thereto. In other embodiments, the first pressing force can also be applied by a pressing pin (e.g. the pressing pin 125 illustrated in FIG. 6) or by any other suitable means disposed in the center compartment C1. The center region of the substrates 200 is corresponding to the center compartment C1 of the bonding head 120 where the first pressing force is applied.

Then, at step S130, a peripheral region of the substrates 200 is pressed together with a second pressing force. In the illustrated embodiment, the second pressing force is applied by the peripheral pneumatic component 126b disposed in the peripheral compartment C2 of the bonding head 120. The peripheral region of the substrates 200 is corresponding to the peripheral compartment C2 of the bonding head 120 where the second pressing force is applied. In some embodiments, the peripheral pneumatic component 126b (and/or the central pneumatic component 126a) may be a pneumatic bladder, which can be inflated or deflated by, for example, a gas pump. The diaphragm 128 with flexibility covers the cavity 122 and is disposed between the peripheral pneumatic component 126b (and/or the central pneumatic component 126a) and the chuck 110. With such arrangement, when the peripheral pneumatic component 126b (and/or the central pneumatic component 126a) is inflated, the diaphragm 128 covering the corresponding compartment is pushed toward the upper substrates 200a to apply the second pressing force, such that the upper substrates 200a is bonded with the lower substrate 200b.

In the embodiments of the substrate 200a having negative warpage (smiling shape) as shown in FIG. 1, the second pressing force applied by the peripheral pneumatic component 126b is substantially greater than the first pressing force applied by the central pneumatic component 126a or the pressing pin 125. Thereby, the warpage of the substrates 200 can be calibrated and the bonding strength between the substrates 200 can be improved. With such configuration, the pressing force applied onto the substrates 200 by the bonding head 120 can be controlled independently to provide superior bonding strength and hermetic quality. In addition, by applying the first pressing force first, issue of delamination or popcorn effect due to air trapped between the substrates 200 can be avoided to improve yield rate of the bonding of the substrates 200.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a bonding apparatus includes a chuck and a bonding head. The chuck is configured to carry a plurality of substrates to be bonded. The bonding head has a cavity facing the chuck and includes a divider, at least one pneumatic component and a diaphragm. The divider is disposed in the cavity and dividing the cavity into a plurality of compartments. The at least one pneumatic component is disposed in at least one of the compartments. The diaphragm covers the cavity and is disposed between the at least one pneumatic component and the chuck.

In accordance with some embodiments of the disclosure, a bonding apparatus includes a chuck and a bonding head. The chuck is configured to carry a plurality of substrates to be bonded. The bonding head has a cavity facing the chuck. The chuck and the bonding head are configured to be movable relative to each other. The bonding head includes a divider, a peripheral pneumatic component and a diaphragm. The divider is disposed in the cavity and divides the cavity into a central compartment and a peripheral compartment surrounding the central compartment. The peripheral pneumatic component is disposed in the peripheral compartment. The diaphragm covers the cavity and is disposed between the pneumatic component and the chuck. The diaphragm is configured to press against the substrates to be bonded when the pneumatic components are inflated.

In accordance with some embodiments of the disclosure, a method of bonding substrates includes the following steps. A plurality of substrates are provided on a chuck. A center region of the substrates is pressed together with a first pressing force. A peripheral region of the substrates is pressed together with a second pressing force, wherein the second pressing force is substantially greater than the first pressing force.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bonding apparatus, comprising:
a chuck configured to carry a plurality of substrates to be bonded; and
a bonding head having a cavity facing the chuck, comprising:
a divider disposed in the cavity and dividing the cavity into a plurality of compartments;
at least one pneumatic component disposed in at least one of the plurality of compartments; and
a diaphragm covering the cavity and disposed between the at least one pneumatic component and the chuck, wherein the diaphragm is configured to press against the plurality of substrates to be bonded when the at least one pneumatic component is inflated.

2. The bonding apparatus as claimed in claim 1, wherein the bonding head further comprises at least one gas inlet in gas communication with the at least one pneumatic component to inflate or deflate the at least one pneumatic component.

3. The bonding apparatus as claimed in claim 1, wherein the plurality of compartments comprises a central compartment and a peripheral compartment surrounding the central compartment.

4. The bonding apparatus as claimed in claim 3, wherein the at least one pneumatic component comprises a central pneumatic component disposed in the central compartment and a peripheral pneumatic component disposed in the peripheral compartment.

5. The bonding apparatus as claimed in claim 3, further comprising a pressing pin movably disposed in the central compartment, wherein the at least one pneumatic component is disposed in the peripheral compartment, and the diaphragm exposes the central compartment and covers the peripheral compartment.

6. The bonding apparatus as claimed in claim 3, wherein the peripheral compartment further comprises a plurality of sub-compartments divided by the divider and together surrounding the central compartment.

7. The bonding apparatus as claimed in claim 6, wherein the at least one pneumatic component comprises a central pneumatic component disposed in the central compartment and a plurality of peripheral pneumatic components disposed in the plurality of sub-compartments respectively.

8. The bonding apparatus as claimed in claim 3, wherein the peripheral compartment further comprises a plurality of concentric compartments divided by the divider and arranged in a concentric manner with respect to the central compartment.

9. The bonding apparatus as claimed in claim 8, wherein the at least one pneumatic component comprises a central pneumatic component disposed in the central compartment and a plurality of peripheral pneumatic components disposed in the plurality of concentric compartments respectively.

10. The bonding apparatus as claimed in claim 1 wherein a diameter of the cavity is substantially greater than a diameter of each of the plurality of substrates to be bonded.

11. A bonding apparatus, comprising:
a chuck configured to carry a plurality of substrates to be bonded; and
a bonding head having a cavity facing the chuck, wherein the chuck and the bonding head are configured to be movable relative to each other, and the bonding head comprises:
a divider disposed in the cavity and dividing the cavity into a central compartment and a peripheral compartment surrounding the central compartment;
at least one peripheral pneumatic component disposed in the peripheral compartment; and
a diaphragm covering the cavity and disposed between the at least one peripheral pneumatic component and the chuck, wherein the diaphragm is configured to press against the plurality of substrates to be bonded when the at least one peripheral pneumatic components are inflated.

12. The bonding apparatus as claimed in claim 11, further comprising a central pneumatic component disposed in the central compartment.

13. The bonding apparatus as claimed in claim 11, further comprising a pressing pin movably disposed in central compartment, wherein the diaphragm exposes the central compartment and covers the peripheral compartment.

14. The bonding apparatus as claimed in claim 11, wherein the peripheral compartment further comprises a plurality of sub-compartments divided by the divider and together surrounding the central compartment, the at least one peripheral pneumatic component comprises a plurality of peripheral pneumatic components disposed in the plurality of sub-compartments respectively.

15. The bonding apparatus as claimed in claim 11, wherein the peripheral compartment further comprises a plurality of concentric compartments divided by the divider and arranged in a concentric manner with respect to the central compartment, the at least one peripheral pneumatic component comprises a plurality of peripheral pneumatic components disposed in the plurality of concentric compartments respectively.

16. The bonding apparatus as claimed in claim 11, wherein a diameter of the cavity is substantially greater than a diameter of each of the plurality of substrates to be bonded.

17. A bonding apparatus, comprising:
a chuck configured to carry a plurality of substrates to be bonded; and
a bonding head having a plurality of compartments facing the chuck, at least one pneumatic component disposed in at least one of the plurality of compartments and configured to be inflated or deflated, and a diaphragm covering the at least one pneumatic component.

18. The bonding apparatus as claimed in claim 17, wherein the plurality of compartments comprises a central compartment and a peripheral compartment surrounding the central compartment, and the at least one pneumatic component at least disposed in the peripheral compartment.

19. The bonding apparatus as claimed in claim 17, wherein the chuck further comprises a positioning cavity facing the bonding head and corresponding to the cavity of the bonding head.

20. The bonding apparatus as claimed in claim 19, wherein the chuck further comprises a positioning mechanism movably disposed in the positioning cavity to hold the plurality of substrates to be bonded in place.

* * * * *